(12) United States Patent
Byun et al.

(10) Patent No.: US 7,973,550 B2
(45) Date of Patent: Jul. 5, 2011

(54) SEMICONDUCTOR DEVICE TEST APPARATUS INCLUDING INTERFACE UNIT AND METHOD OF TESTING SEMICONDUCTOR DEVICE USING THE SAME

(75) Inventors: Eun-Jo Byun, Yongin-si (KR);
Sang-Hoon Lee, Hwaseong-si (KR);
Se-Jang Oh, Seongnam-si (KR);
Cheol-Jong Woo, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/582,980

(22) Filed: Oct. 21, 2009

(65) Prior Publication Data
US 2010/0182035 A1   Jul. 22, 2010

(30) Foreign Application Priority Data
Jan. 20, 2009   (KR) .................. 10-2009-0004645

(51) Int. Cl.
*G01R 31/02* (2006.01)
*G01R 31/26* (2006.01)

(52) U.S. Cl. .................................. 324/762.01
(58) Field of Classification Search .......... None
See application file for complete search history.

(56) References Cited

U.S. PATENT DOCUMENTS
7,265,570 B2 *   9/2007   Ong .......................... 324/765

FOREIGN PATENT DOCUMENTS
| JP | 2001-243087 | 9/2001 |
| JP | 2004-227645 | 8/2004 |
| JP | 2006-214913 | 8/2006 |

* cited by examiner

*Primary Examiner* — Roberto Velez
(74) *Attorney, Agent, or Firm* — F. Chau & Associates, LLC

(57) ABSTRACT

A semiconductor device test apparatus is provided. The semiconductor device test apparatus includes a test unit on which a semiconductor device under test is disposed, and an automatic test equipment (ATE) unit that inputs a test signal to the test unit and reads a test result signal output by the test unit. The semiconductor device test apparatus includes an interface unit that is interposed between the test unit and the ATE unit, and that compares the test signal with the test result signal and outputs to the ATE unit comparison signals indicating whether the semiconductor device is a failure or not or whether a specific bit failure has occurred or not.

13 Claims, 4 Drawing Sheets

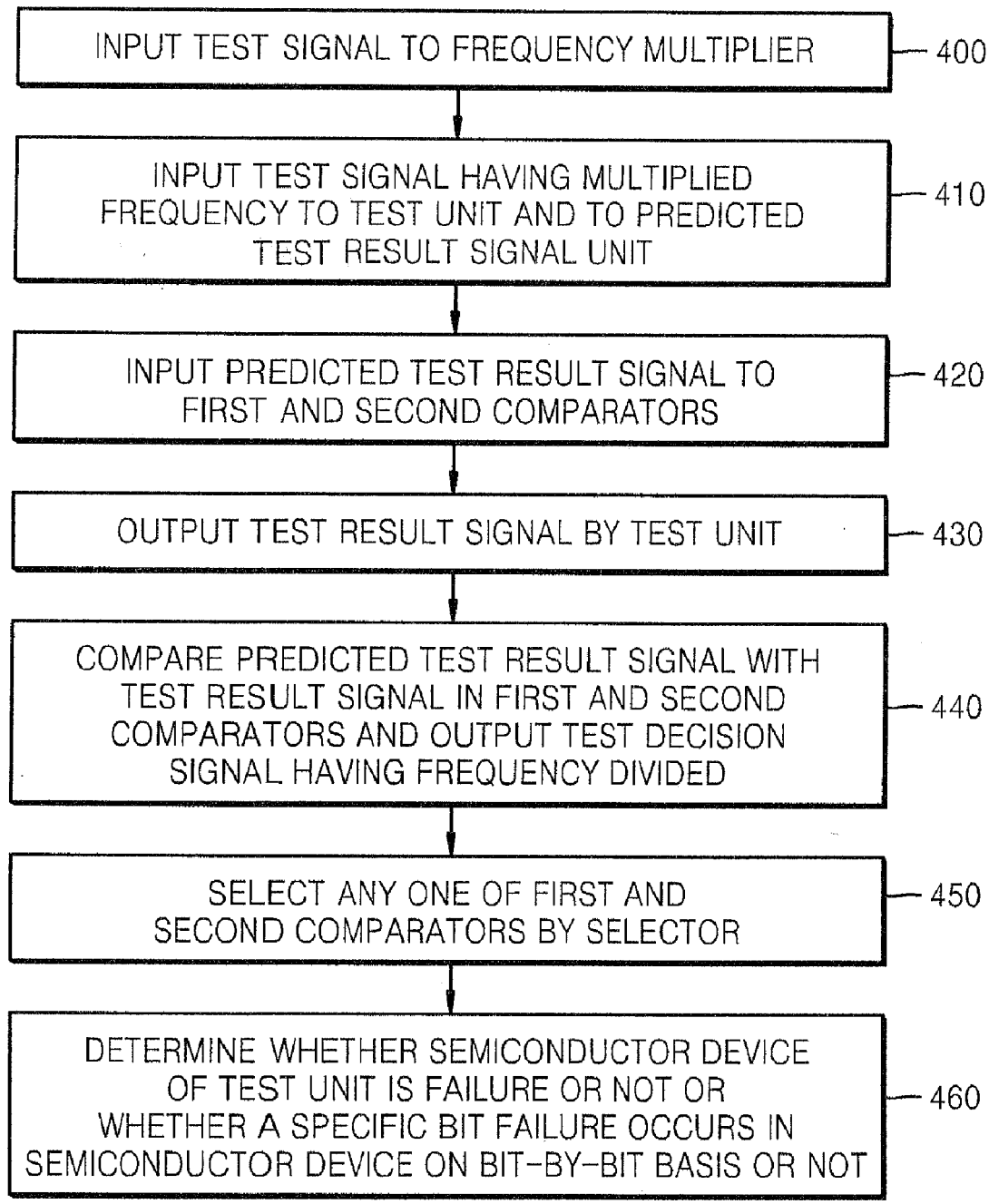

SEMICONDUCTOR DEVICE TEST APPARATUS INCLUDING INTERFACE UNIT AND METHOD OF TESTING SEMICONDUCTOR DEVICE USING THE SAME

CROSS-REFERENCE TO RELATED APPLICATION

This application claims priority to and the benefit of Korean Patent Application No. 10-2009-0004645, filed on Jan. 20, 2009, in the Korean Intellectual Property Office, the entire content of which is incorporated by reference herein.

BACKGROUND

The present disclosure relates to test apparatuses, and, more particularly to a semiconductor device test apparatus and a method of testing a semiconductor device using the same.

In general, after being manufactured semiconductor devices are functionally tested using semiconductor device test apparatuses. Typical semiconductor device test apparatuses are very expensive and can be categorized into analog device test apparatuses, digital device test apparatuses, and mixed signal device test apparatuses. Digital device test apparatuses can be categorized into memory device test apparatuses and logic device test apparatuses.

FIG. 1 is a block diagram illustrating a conventional semiconductor device test apparatus 10.

Referring to FIG. 1, the conventional semiconductor device test apparatus 10 includes an automatic test equipment (ATE) unit 12, and test unit 16 on which a semiconductor device 14 (i.e., the device under test (DUT)) is disposed. The ATE unit 12 writes (inputs) a test signal 18 having a predetermined frequency to the semiconductor device 14 of the test unit 16 and reads test result signals 20 of the predetermined frequency output by the semiconductor device 14 of the test unit 16, thereby determining whether the semiconductor device 14 is a failure or not.

However, since the typical semiconductor device test apparatus as illustrated in FIG. 1 simply determines whether a semiconductor device of a test unit is a failure (good) or not, it becomes difficult to identify a specific bit failure in the semiconductor device of the test unit. In addition, with performance improvements of microprocessors, the driving speed of semiconductor devices, such as semiconductor memory devices, has increased. That is, the driving frequency of semiconductor devices has increased from 200 MHz to 400 MHz and 800 Hz. Accordingly, convention semiconductor device test apparatuses having low driving speeds cannot be used to test semiconductor devices having such high driving speeds.

SUMMARY

An exemplary embodiment of the present invention a semiconductor device test apparatus includes a test unit on which a semiconductor device under test is disposed, an automatic test equipment unit that initiates testing and that makes a testing conclusion, and an interface unit, interposed between the test unit and the automatic test equipment unit, that compares a predicted test result signal with a test result signal from the test unit and outputs to the automatic test equipment unit a comparison signal that indicates whether the semiconductor device is a failure or not or a comparison signal that indicates whether a specific bit failure has occurred or not.

The interface unit may include a first comparator that outputs the comparison signal that indicates whether the semiconductor device of the test unit is a failure or not.

The interface unit may include a second comparator having a phase selector and the second comparator may output on a bit-by-bit basis the comparison signal that indicates whether a specific bit failure occurs in the semiconductor device of the test unit.

The interface unit may include a frequency multiplier that multiplies a frequency of the test signal output by the automatic test equipment unit.

The interface unit may include an input multiplier unit responsive to a test signal and configured to multiply the test signal such that a multiplied test signal matches a driving speed of a semiconductor device under test and to apply the multiplied test signal to the semiconductor device under test, a predicted test result unit configured to provide a predicted test result signal based upon the multiplied test signal, an output selection unit responsive to a test result selection signal and configured to output first comparison signals indicative of whether the semiconductor device under test is a failure or not, or second comparison signals indicative of whether a specific bit failure has occurred or not, and a comparison unit coupled between the input multiplier unit and the output selection unit and configured to receive in response to the multiplied test signal being applied to the semiconductor device under test, a test result signal from the semiconductor device under test and to compare the test result signal and the predicted test result signal to provide the first comparison signals and the second comparison signals for output by the output selection unit.

The comparison unit may include: a first comparator that compares the test result signal with the predicted test result signal to provide a first pass comparison signal indicative of the semiconductor device under test passing the test or a first fail comparison signal indicative of the semiconductor device under test failing the test, and a second comparator that compares the test result signal with the predicted test result signal to provide a second pass comparison signal indicative of the semiconductor device under test passing a specific bit test or a second fail comparison signal indicative of the semiconductor device under test failing a specific bit test.

The second comparator may further include a phase selector that provides a second pass comparison signal indicative of the pass phase of the test semiconductor device under test or a second fail comparison signal indicative of a fail phase of the semiconductor device under test.

The semiconductor device under test may be a double-date-rate synchronous random access memory and the test signal may be one of a clock signal, an address signal, a data signal or a control signal.

The test signal may have a frequency of 200 MHz or less and the multiplied test signal may have a frequency of 400 MHz or more.

According to an exemplary embodiment of the present invention a semiconductor device test apparatus includes an automatic test equipment unit that inputs a test signal having a first frequency to a frequency multiplier that multiplies the first frequency and applies a test signal having a second frequency to the test unit, a test unit on which a semiconductor device under test is disposed, a predicted test result signal unit, responsive to the test signal having a second frequency, that provides a predicted test result signal based upon the test signal being applied to the test unit, a first comparator, to which a test result signal having the second frequency that is output by the semiconductor device of the test unit is input, and to which a predicted test result signal having the second frequency based upon the test signal having the second frequency from the frequency multiplier, and which compares the test result signal with the predicted test result signal and outputs a high level comparison signal or low level comparison signal having the first frequency, a second comparator to which the test result signal having the second frequency that is output by the semiconductor device of the test unit is input, to which the predicted test result signal having the second frequency is input from the frequency multiplier, and which comprises a phase selector and compares the phase of the predicted test result signal with the phase of the test result signal and outputs a comparison signal having the first frequency, and a selector that selects either the first comparator or the second comparator according to a selection signal transmitted by the automatic test equipment unit.

The frequency multiplier, the first comparator, and the second comparator may be in an interface unit between the test unit and the automatic test equipment unit.

The high level comparison signal or the low level comparison signal output by the first comparator may include a signal that indicates whether the semiconductor device of the test unit is a failure or not.

The comparison signal output by the second comparator may include a signal indicating whether a specific bit failure occurs in the semiconductor device of the test unit on a bit-by-bit basis.

According to an exemplary embodiment of the present invention method of testing a semiconductor device is provided. A test signal having a first frequency output by an automatic test equipment unit is input to a frequency multiplier. A test signal having a second frequency that is generated by multiplying the first frequency is input to a test unit on which a semiconductor device under test is disposed and to a predicted test result unit that provides a predicted test result based upon the test signal having a second frequency to a first comparator and to a second comparator. An output test result signal having the second frequency is output by the test unit. The output test result signal is input to the first comparator and to the second comparator and a comparison signal having the first frequency is output. Either the first comparator or the second comparator is selected by a selector controlled by the automatic test equipment unit. The comparison signal of a selected comparator is input to the automatic test equipment unit to provide a testing conclusion as to whether the semiconductor device under test is a failure or not or whether a specific bit failure of the semiconductor device under test on a bit-by-bit basis has occurred or not.

The first comparator may output the comparison signal indicating whether the semiconductor device of the test unit is a failure or not, and the second comparator may output the comparison signal indicating whether a specific bit failure has occurred in the semiconductor device under test on a bit-by-bit basis or not.

BRIEF DESCRIPTION OF THE DRAWINGS

Exemplary embodiments of the present invention will now be described in conjunction with the accompanying drawings in which:

FIG. 5 is a flow diagram illustrating a method of testing a semiconductor device of a test unit using a semiconductor device test apparatus according to an exemplary embodiment of the present invention.

DETAILED DESCRIPTION OF THE EXEMPLARY EMBODIMENTS

Figure 1:
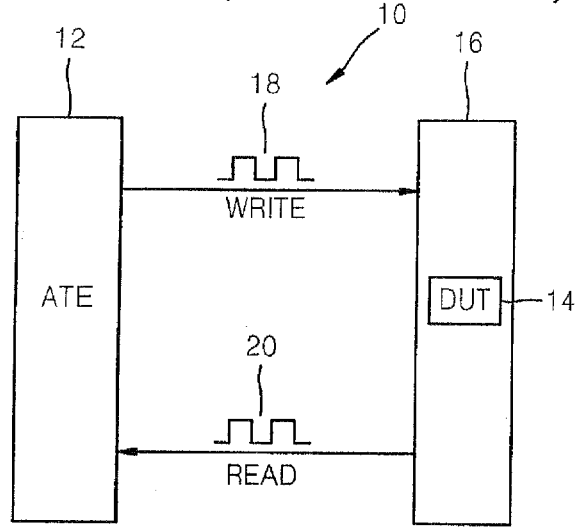
FIG. 1 is a block diagram illustrating a conventional semiconductor device test apparatus.

Exemplary embodiments of the present invention will now be described more fully with reference to the accompanying drawings. However, the present invention may be embodied in many different forms and should not be construed as being limited to the exemplary embodiments set forth herein. Like reference numerals in the drawings denote like elements.

Figure 2:
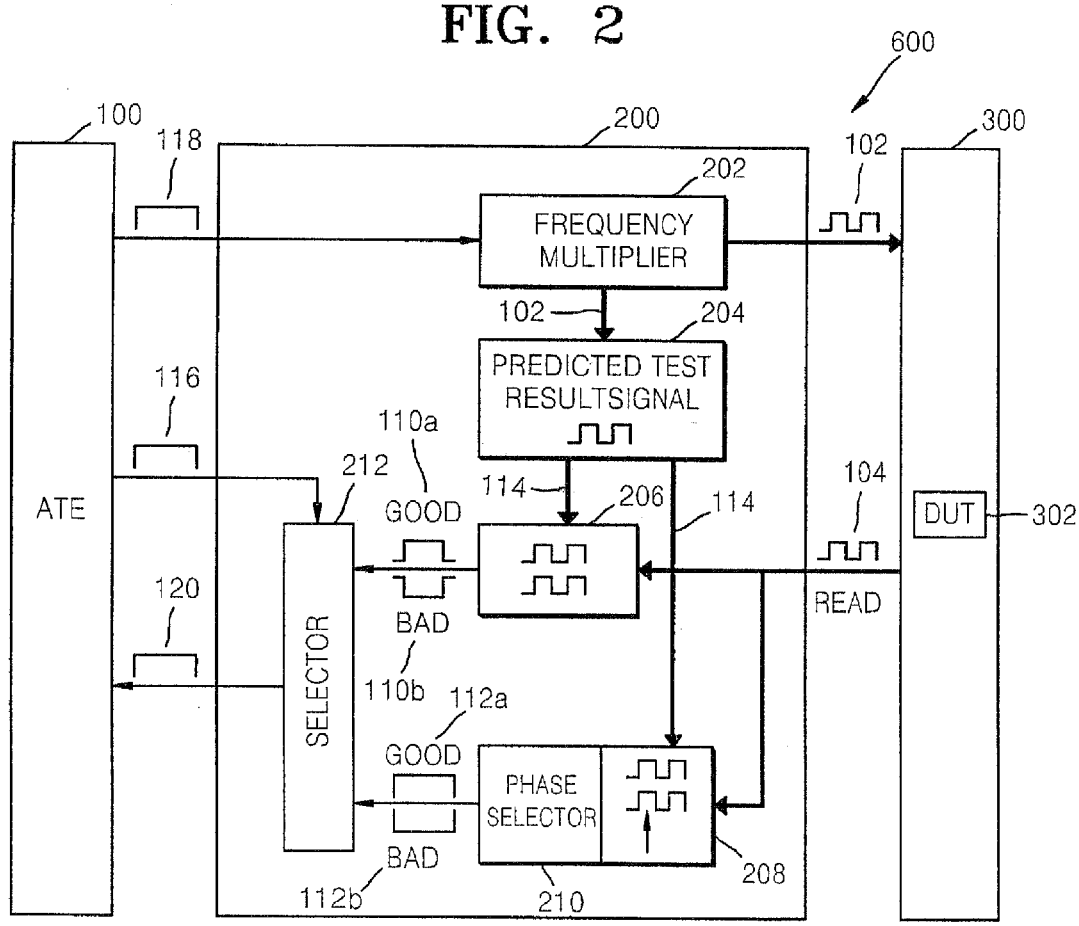
FIG. 2 a block diagram illustrating a semiconductor device test apparatus according to an exemplary embodiment of the present invention.

FIG. 2 is a block diagram illustrating a semiconductor device test apparatus 600 according to an exemplary embodiment of the present invention. The semiconductor device test apparatus 600 includes an automatic test equipment ATE unit 100, a test unit 300 on which a semiconductor device 302 under test is disposed, and an interface unit 200 between the ATE unit 100 and the test unit 300. The semiconductor device 302 disposed on the test unit 300 can be a semiconductor chip or wafer, or the like. The test unit 300 on which the semiconductor device 302 is disposed can be a test board, or other structure that can mount a device under test. The semiconductor device test apparatus 600 in the exemplary embodiment is an apparatus for testing a semiconductor memory device. The semiconductor memory device can be, for example, a double-data-rate synchronous random access memory (DDR SDRAM).

The ATE unit 100, in conjunction with interface unit 200, initiates the development of a test signal 102 having a predetermined frequency to the semiconductor device 302 of the test unit 300, and makes a testing conclusion based upon a test result signal 104 output by the semiconductor device 302 of the test unit 300. Specifically, the ATE unit 100, based upon the test result signal 104, determines whether the semiconductor device 302 of the test unit 300 is a failure (BAD) or not (GOOD) and analyzes a specific bit failure.

The test signal 102 is a signal that has a test waveform of the predetermined frequency and has a current level at which the semiconductor device 302 of the test unit 300 is actually driven or operated. When the semiconductor device 302 is a DDR SDRAM, the test signal 102 can be a clock signal CLK, an address signal ADDR, a data signal DQs, or a control signal (/RAS, /CAS), or other signal that can provide a performance determination of the semiconductor device 302.

The interface unit 200 is interposed between the ATE unit 100 and the test unit 300. The interface unit 200 includes: first and second comparators 206, 208 that compare the test result signal output 104 by the semiconductor device 302 of the test unit 300 with a predicted test result signal 114 output by a predicted test result signal unit 204 and output comparison signals 110a, 110b, 112a, 112b and a selector 212 for selecting signals from the first and second comparators 206, 208 and provide a selected signal 120 to ATE 100, the selected signal 120 being one of the comparison signals 110a, 110b, 112a, 112b. The first and second comparators 206, 208 are respective comparator circuits and the selector 212 is a selector circuit.

The first comparator 206 compares the predicted test result signal 114 with the test result signal 104 output by the semiconductor device 302 of the test unit 300 and outputs a high level comparison signal (pass signal) 110a or a low level comparison signal (fail signal) 110b to the ATE unit 100 through the selector 212. Based upon the comparison signal output by the first comparator 206, the ATE unit 100 determines whether the semiconductor device 302 is a failure or not.

The second comparator 208 includes a phase selector 210. Thus, the second comparator 208 compares the predicted test result signal 114 output by the predicted test result signal unit 204 with the test result signal 104 output by the semiconductor device 302 of the test unit 300 and outputs a comparison signal 112a, 112b indicating whether a bit failure occurs on a bit-by-bit basis in the semiconductor device 302 of the test unit 300 to the ATE unit 100 through the selector 212 by using the phase selector 210. Based upon the comparison signal 112a, 112b that is output by the second comparator 208 on a bit-by-bit basis, the ATE unit 100 determines whether a bit failure has occurred on a bit-by-bit basis.

In particular, the second comparator 208 transmits the phase of the test result signal 104 output by the semiconductor device 302 of the test unit 300 to the ATE unit 100 through the selector 212 to determine whether the semiconductor device 302 is a failure or not on a bit-by-bit basis. The ATE unit 100 transmits a selection signal 116 to the selector 212 such that either the first comparator 206 or the second comparator 208 can be selected.

The interface unit 200 multiplies or divides driving (transmission) speeds of the test signal and test result signal, that is, frequencies of the test signal and test result signal. The interface unit 200 includes a frequency multiplier 202 that multiplies the frequency of the initial test signal 118 by N times, for example, two times, to be matched with the driving speed of the semiconductor device 302 of the test unit 300. The interface unit 200 multiplies an initial test signal 118, for example, one having slower driving speed of 10 nano seconds (NS) at a first frequency, by N, for example, 2, to arrive at a faster driving speed of 5 NS at a second frequency, so that the driving speed is matched with the faster driving speed of the semiconductor device 302 of the test unit 300. The frequency multiplier 202 can be a phase locked loop circuit (PLL) that multiplies the frequency of the test signal N times and increases the speed of the test signal applied to the device under test. The multiplied test signal is provided to predicted test result signal unit 204 which, based upon the multiplied test signal provides a predicted test result signal 114 for transmission to first and second comparators 206, 208.

The ATE unit 100 transmits the initial test signal 118 having a first frequency that is a low frequency, for example, 200 or less MHz to the frequency multiplier 202, and the frequency multiplier 202 multiplies the first frequency by N so that the test signal 102 has a second frequency, for example, 400 or more MHz. The test signal 102 having the second frequency is input to the semiconductor device 302 of the test unit 300. When a test is performed, a test result signal 104 having the second frequency is output. When the test result signal passes through the first comparator 206 and the second comparator 208, the second frequency is divided by N so that a comparison signal 110a, 110b, 112a, 112b having the first frequency can be input to the selector 212.

The interface unit 200 illustrated in FIG. 2 may further include an input and output unit (not shown) between the ATE unit 100 and the interface unit 200 or between the interface unit 200 and the test unit 300.

Figure 3:
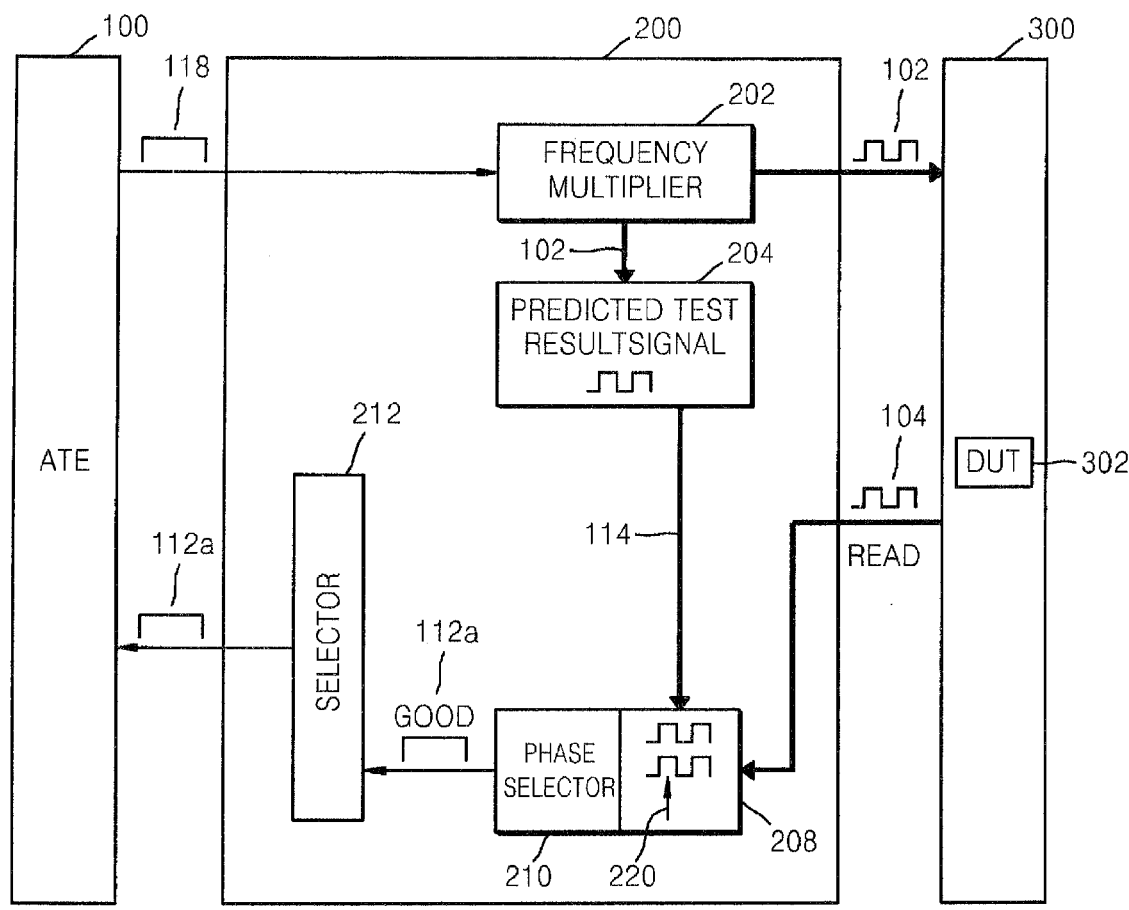
FIGS. 3 and 4 are block diagrams for describing a driving operation of the semiconductor device test apparatus illustrated in FIG. 2 using a second comparator.
Figure 4:
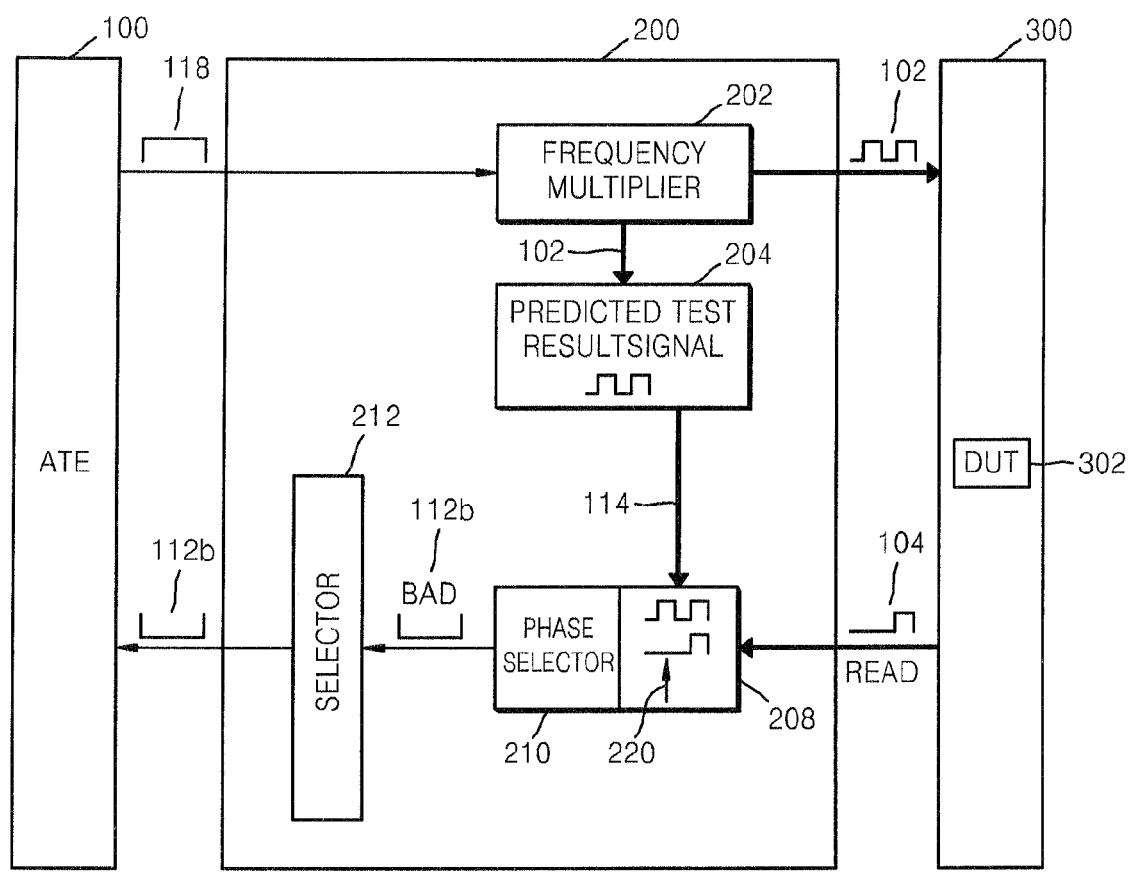

FIGS. 3 and 4 are block diagrams for describing the driving operation of the semiconductor device test apparatus 600 illustrated in FIG. 2 using the second comparator 208.

Specifically, FIG. 3 is a diagram for explaining the case when a bit failure does not occur in the semiconductor device 302 of the test unit 300 using the second comparator 208, and FIG. 4 is a diagram for explaining the case when a bit failure does occur in the semiconductor device 302 of the test unit 300 using the second comparator 208. The ATE unit 100 provides the initial test signal 118 having the first frequency to the frequency multiplier 202. The frequency multiplier 202 multiplies the test signal having the first frequency to form the test signal 102 having the second frequency, such that an applied test signal is matched with the driving speed of the semiconductor device 302 of the test unit 300, and inputs the test signal 102 having the second frequency to the semiconductor device 302 of the test unit 300 and to predicted test result signal unit 204. The predicted test result signal unit determines an expected "pass" test result and provides predicted test result signal 114 to second comparator 208. The semiconductor device 302 is tested and the test result signal 104 having the second frequency is output by the test unit 300.

The test, result signal output by the test unit 300 is input to the second comparator 208 and then compared with the predicted test result signal 114. The second comparator 208 selects a particular phase of the test result signal indicated by the arrow 220 and divides the frequency of the test result signal by N and outputs the comparison signal 112a (e.g., a GOOD signal) having the first frequency to the selector 212. Thus, the frequency of the comparison signal 112a output by the second comparator 208 becomes lowered.

Referring to the exemplary embodiment depicted in FIG. 3, the test result signal 104 and the predicted test result signal 114 have the same phases and thus a specific bit failure does not occur in the semiconductor device 302 of the test unit 300 on a bit-by-bit basis. On the other hand, referring to FIG. 4, the test result signal 104 and the predicted test result signal 114 have different phases and thus a specific bit failure occurs in the semiconductor device 302 of the test unit 300. That is, a comparison signal 112b (e.g., a BAD signal) having a particular phase and a frequency lowered by the second comparator 208 is input to the selector 212, and the selector 212 transmits the selected comparison signal 112b to the ATE unit 100, thereby determining whether the semiconductor device 302 is a failure or not on a bit-by-bit basis.

FIG. 5 is a flow diagram illustrating a method of testing a semiconductor device of a test unit using a semiconductor device test apparatus, according to an exemplary embodiment of the present invention. An ATE unit transmits a test signal having a first frequency to a frequency multiplier (operation 400). To match the driving speed of the semiconductor device of the test unit, the test signal having the first frequency is multiplied so that the test signal has a second frequency. The test signal having the second frequency is input to the test unit and to a predicted test result signal unit (operation 410)

The predicted test result signal unit determines the predicted test result based upon the second frequency and provides a predicted test result signal to a first comparator and to a second comparator (operation 420).

The semiconductor device under test in the test unit is tested and the test unit outputs a test result signal having the second frequency (operation 430). The output test result signal is input to the first comparator and to the second comparator, and thus a comparison signal having the first frequency is output (operation 440). That is, the first comparator compares the predicted test result signal with the test result signal and divides the second frequency by N and outputs a comparison signal having the first frequency, such as a high level decision signal (pass signal) or low level decision signal (fail signal). The second comparator selects a particular phase of the test result signal and divides the second frequency by N and outputs a comparison signal having the first frequency to the selector.

The ATE unit inputs a selection signal to the selector so as to select either one of the first comparator and the second comparator (operation 450). The comparison signal output by the selected comparator is input to the ATE unit, and the ATE unit makes a testing determination as to whether the semiconductor device 302 is a failure or not or whether a specific bit failure occurs or not (operation 460). That is, when the first comparator is selected a testing conclusion is provided as to whether the semiconductor device is a failure or not, and when the second comparator is selected a testing conclusion is provided as to whether a specific bit failure has occurred in the semiconductor device on a bit-by-bit basis or not.

While exemplary embodiments of the present invention have been particularly shown and described, it will be understood that various changes in form and details may be made therein without departing from the spirit and scope of the following claims.

What is claimed is:

1. A semiconductor device test apparatus comprising:
   a test unit on which a semiconductor device under test is disposed;
   an automatic test equipment unit that initiates testing and that makes a testing conclusion; and
   an interface unit, interposed between the test unit and the automatic test equipment unit, that compares a predicted test result signal with a test result signal from the test unit and outputs to the automatic test equipment unit:
      a comparison signal that indicates whether the semiconductor device is a failure or not, or
      a comparison signal that indicates whether a specific bit failure has occurred or not,
   wherein the interface unit comprises:
      a first comparator that outputs the comparison signal that indicates whether the semiconductor device of the test unit is a failure or not, and
      a second comparator comprising a phase selector, the second comparator configured to output on a bit-by-bit basis the comparison signal that indicates whether a specific bit failure occurs in the semiconductor device of the test unit or not.

2. The semiconductor device test apparatus of claim 1, wherein the interface unit comprises a frequency multiplier that multiplies a frequency of the test signal output by the automatic test equipment unit.

3. The semiconductor device test apparatus of claim 1, wherein the interface unit comprises:
   an input multiplier unit responsive to a test signal and configured to multiply the test signal such that a multiplied test signal matches a driving speed of the semiconductor device under test and to apply the multiplied test signal to the semiconductor device under test;
   a predicted test result unit configured to provide the predicted test result signal based upon the multiplied test signal;
   an output selection unit responsive to a test result selection signal and configured to output first comparison signals indicative of whether the semiconductor device under test is a failure or not, or second comparison signals indicative of whether a specific bit failure has occurred or not; and
   a comparison unit coupled between the input multiplier unit and the output selection unit and configured to receive in response to the multiplied test signal being applied to the semiconductor device under test, the test result signal from the semiconductor device under test and to compare the test result signal and the predicted test result signal to provide the first comparison signals or the second comparison signals for output by the output selection unit.

4. The semiconductor test apparatus of claim 3, wherein the comparison unit comprises:
   a first comparator that compares the test result signal with the predicted test result signal to provide a first pass comparison signal indicative of the semiconductor device under test passing the test or a first fail comparison signal indicative, of the semiconductor device under test failing the test; and
   a second comparator that compares the test result signal with the predicted test result signal to provide a second pass comparison signal indicative of the semiconductor device under test passing a specific bit test or a second fail comparison signal indicative of the semiconductor device under test failing a specific bit test.

5. The semiconductor test apparatus of claim 4, wherein the second comparator further comprises a phase selector that provides a second pass comparison signal indicative of the pass phase of the test semiconductor device under test or a second fail comparison signal indicative of a fail phase of the semiconductor device under test.

6. The semiconductor test apparatus of claim 3, wherein the semiconductor device under test is a double-date-rate synchronous random access memory and the test signal is one of a clock signal, an address signal, a data signal or a control signal.

7. The semiconductor test apparatus of claim 3, wherein the test signal has a frequency of 200 MHz or less and the multiplied test signal has a frequency of 400 MHz or more.

8. A semiconductor device test apparatus comprising:
   an automatic test equipment unit that inputs a test signal having a first frequency to a frequency multiplier that multiplies the first frequency and applies a test signal having a second frequency to the test unit;
   a test unit on which a semiconductor device under test is disposed,
   a predicted test result signal unit, responsive to the test signal having a second frequency, that provides a predicted test result signal based upon the test signal being applied to the test unit;
   a first comparator, to which a test result signal having the second frequency that is output by the semiconductor device of the test unit is input, and to which a predicted test result signal having the second frequency based upon the test signal having the second frequency from the frequency multiplier, and which compares the test result signal with the predicted test result signal and outputs a high level comparison signal or low level comparison signal having the first frequency;
   a second comparator to which the test result signal having the second frequency that is output by the semiconductor device of the test unit is input, to which the test signal having the second frequency is input from the frequency multiplier, and which comprises a phase selector and compares the phase of the predicted test result signal with the phase of the test result signal and outputs a comparison signal having the first frequency; and
   a selector that selects either the first comparator or the second comparator according to a selection signal transmitted by the automatic test equipment unit.

9. The semiconductor device test apparatus of claim 8, wherein the frequency multiplier, the first comparator, and the second comparator are in an interface unit between the test unit and the automatic test equipment unit.

10. The semiconductor device test apparatus of claim 8, wherein the high level comparison signal or the low level comparison signal output by the first comparator comprises a signal that indicates whether the semiconductor device of the test unit is a failure or not.

11. The semiconductor device test apparatus of claim 8, wherein the comparison signal output by the second comparator comprises a signal indicating whether a specific bit failure occurs in the semiconductor device of the test unit on a bit-by-bit basis or not.

12. A method of testing a semiconductor device, the method comprising:

inputting to a frequency multiplier a test signal having a first frequency output by an automatic test equipment unit;

inputting a test signal having a second frequency that is generated by multiplying the first frequency to a test unit on which a semiconductor device under test is disposed and to a predicted test result unit that provides a predicted test result based upon the test signal having a second frequency to a first comparator and to a second comparator;

outputting by the test unit an output test result signal having the second frequency;

inputting the output test result signal to the first comparator and to the second comparator and outputting a comparison signal having the first frequency;

selecting by a selector controlled by the automatic test equipment unit either the first comparator or the second comparator; and inputting the comparison signal of a selected comparator to the automatic test equipment unit to provide a testing conclusion as to:

whether the semiconductor device under test is a failure or not, or whether a specific bit failure of the semiconductor device under test on a bit-by-bit basis has occurred or not.

13. The method of claim 12, wherein the first comparator outputs the comparison signal indicating whether the semiconductor device of the test unit is a failure or not, and the second comparator outputs the comparison signal indicating whether a specific bit failure has occurred in the semiconductor device under test on a bit-by-bit basis or not.

\* \* \* \* \*